United States Patent [19]
Prabhu et al.

[11] Patent Number: 5,581,876
[45] Date of Patent: Dec. 10, 1996

[54] METHOD OF ADHERING GREEN TAPE TO A METAL SUPPORT SUBSTRATE WITH A BONDING GLASS

[75] Inventors: Ashok N. Prabhu; Barry J. Thaler, both of Mercer, N.J.

[73] Assignee: David Sarnoff Research Center, Inc., Princeton, N.J.

[21] Appl. No.: 379,263

[22] Filed: Jan. 27, 1995

[51] Int. Cl.$^6$ ..................................... H01K 3/22
[52] U.S. Cl. ..................... 29/851; 29/831; 156/89; 156/320; 428/209; 428/210
[58] Field of Search ................... 29/846, 848, 830, 29/831, 851; 156/89, 320; 428/209, 210, 901, 432

[56] References Cited

U.S. PATENT DOCUMENTS

| | | | |
|---|---|---|---|
| 4,712,161 | 12/1987 | Pryor et al. | 29/846 X |
| 4,808,460 | 2/1989 | Chyung et al. | 428/116 |
| 4,997,698 | 3/1991 | Oboodi et al. | 428/210 X |
| 5,013,360 | 5/1991 | Finkelstein et al. | 428/432 X |
| 5,043,222 | 8/1991 | Cherukuri et al. | 428/432 |
| 5,044,074 | 9/1991 | Hadwiger et al. | 29/848 |
| 5,256,469 | 10/1993 | Cherukuri et al. | 428/210 |
| 5,277,724 | 1/1994 | Prabhu | 156/89 |

*Primary Examiner*—Peter Vo
*Assistant Examiner*—Khan V. Nguyen
*Attorney, Agent, or Firm*—William J. Burke

[57] ABSTRACT

In the manufacture of ceramic circuit boards having ceramic or metal support substrates, a bonding glass layer that is adherent both to the substrate material and to multilayer green tape compositions having circuitry printed thereon, is deposited and flowed onto the support substrate. The bonding glasses suitable for use with nickel plated metal substrates and green tape compositions containing forsterite-cordierite-type glasses are mixed oxides including calcium, zinc and boron as well as other oxides. These bonding glasses have a thermal coefficient of expansion that is larger than said metal substrate, and a flow temperature below that of said cordierite-type glasses.

12 Claims, 1 Drawing Sheet

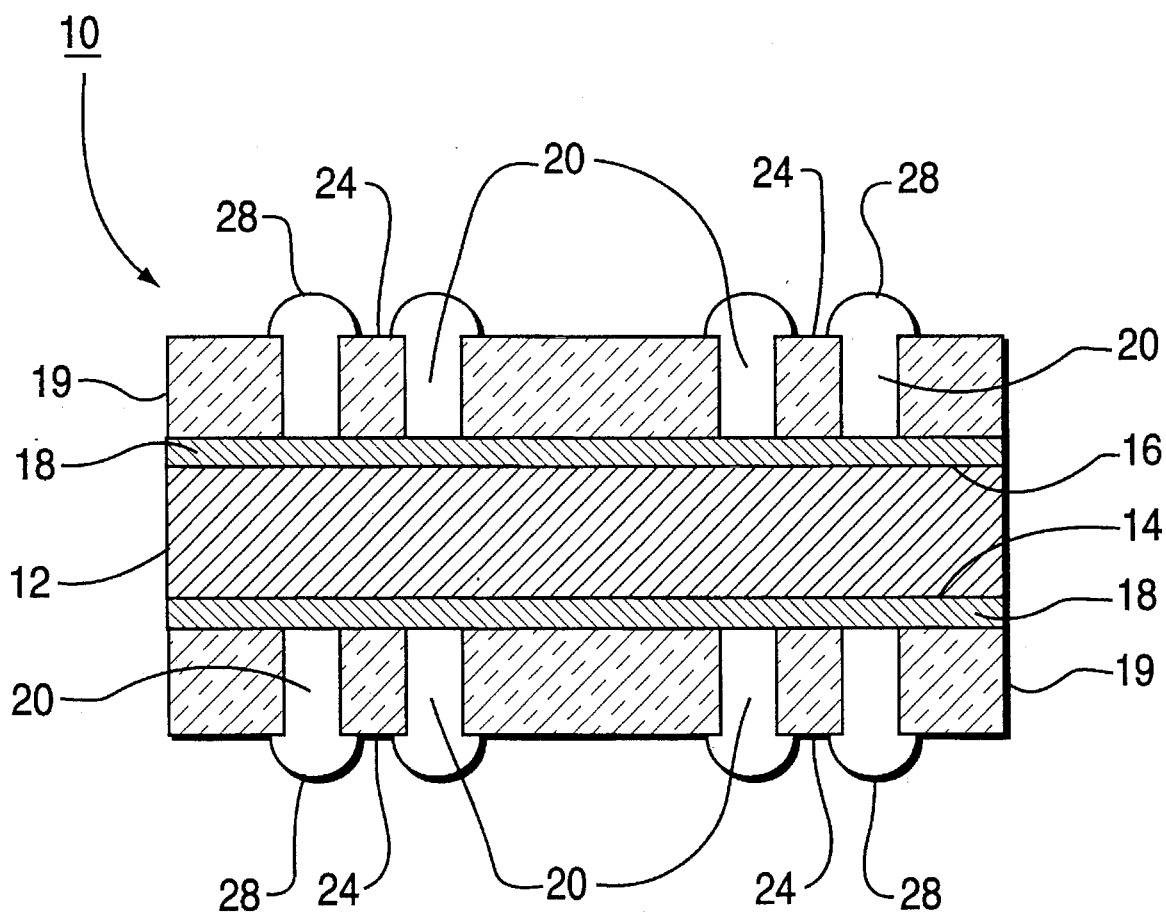

METHOD OF ADHERING GREEN TAPE TO A METAL SUPPORT SUBSTRATE WITH A BONDING GLASS

This invention was made with Government support under DAAB07-94-C-C009 awarded by the US Department of the Army. The Government has certain rights in this invention.

This invention relates to the manufacture of high density co-fired ceramic multilayer circuit boards. More particularly, this invention relates to the manufacture of such co-fired multilayer circuit boards connected to both sides of a thermally conductive support substrate.

BACKGROUND OF THE INVENTION

Multilayered co-fired ceramic circuit boards are well known and are fabricated from a stack of layers of ceramic dielectric tape, known as green tape, each layer of which may include a printed metal pattern to form a circuit. Each of the layers has a plurality of small holes, or vias, punched therein which can be filled with a conductive metal so that the various circuit layers may contact each other electrically. The green tape comprises a ceramic and/or glass powder admixed with a suitable organic binder or resin, a solvent, a plasticizer and a surfactant. The manufacturing process for making high density co-fired, ceramic multilayer circuit boards includes stacking a plurality of pre-fabricated green tape layers having via holes punched therein, and circuit patterns printed thereon by applying a conductive ink, i.e., a mixture of a conductive metal powder and a glass powder in a solvent mixture, to fill the vias, and laminating the tape layers together by pressing them in a stack. The stacked layers are then fired at elevated temperatures of over 700° C. This firing burns off the organic material and densifies the glass and/or ceramic used to make the green tape.

Since the fired glass or ceramic circuit boards are fragile, the circuit boards can be attached to one or both sides of a suitable support substrate, or core, to impart additional mechanical strength to the printed circuit board. In the case of a double-sided ceramic-on-metal support substrate, insulated electrical feedthroughs in the metal core can be provided to contact the circuit vias in the multilayer ceramic substrate to further increase the circuit density.

A preferred method of forming such supported multilayer substrates is to form multilayer laminates using green tapes and conductive metal-containing inks in conventional manner, placing the laminates on one or both sides of a suitable prepared support substrate, and firing the composite structure together to the temperature required to remove the organic materials of the green tapes and the conductor inks, to sinter or densify the glass particles of the green tape composition and the metal particles of the conductor inks, and to adhere the resulting multilayer ceramic substrates to the support substrate.

Ordinarily, the removal of organic materials from the green tapes and their subsequent densification results in a large degree of volume shrinkage in the ceramic, up to about 20%, in the x, y and z dimensions. However, since the support substrate in the above described supported printed circuit boards does not undergo any densification shrinkage, the large shrinkage of the green tapes, especially in the x and y dimensions, will lead to substantial problems such as non-adherence to the support substrate and serious misalignment between the vias in the multilayer ceramic layers and the electrical feedthroughs on the support substrate they are supposed to contact. Thus some method of restraining the shrinkage of the green tape layer, at least in the x and y lateral dimensions, must be provided for.

One method for restraining the lateral shrinkage of the green tape laminate fired on a support substrate is to provide a bonding layer between the laminate and the support substrate that is capable of adhering the laminate to the support substrate before the onset of densification shrinkage in the laminate. A glass bonding layer has been proposed to accomplish this, for a specific set of metal core and ceramic composition, see U.S. Pat. No. 5,277,724 to Prabhu. The glass bonding layer must be adherent to the support substrate and to the ceramic or glass of the laminate. Thus when the green tape laminate placed on the bonding glass layer is fired, the glass bonding layer suppresses shrinkage in the x and y lateral directions, with the result that almost all of the shrinkage in the green tape layers occurs in the thickness, or z, dimension. Thus vias and contacts in the multilayer ceramic stack and in the support substrate remain in alignment with each other during firing. Cherukuri et al, U.S. Pat. No. 5,256,469, disclose Pb-Zn-Ba borosilicate glasses as bonding glasses suitable for a variety of support substrates and magnesium-containing green tape ceramics of the $MgO-B_2O_3-SiO_2$ type. These ceramics have a thermal coefficient of expansion for the fired ceramic of $90-130 \times 10^{-7}/°C$.

When a green tape stack is to be laminated to both sides of a ceramic or metal support substrate, to further increase the density of devices on the circuit board, the problem of shrinkage becomes critical. The multilayer circuits on both sides of the support substrate, which are connected through via holes in and contact pads on the support substrate, must remain in registration with these via holes and contact pads. Since the ceramic or metal support or core does not shrink perceptibly during firing, the amount of shrinkage of the glass/ceramic green tapes that can be tolerated in the x and y directions can only be about 1% or less in order to maintain registration between the various layers and the vias in the support substrate.

Thus it is desired to provide a bonding layer to bond a forsterite-cordierite-type glass/ceramic to a ceramic or metal support substrate, such as a nickel plated Cu/Mo/Cu (13/74/13) substrate or a Kovar substrate, that will prevent x-y shrinkage greater than 1% between the support substrate and the glass/ceramic during sintering of the green tape at temperatures up to about 950° C.

SUMMARY OF THE INVENTION

We have identified bonding glasses that will prevent shrinkage between ceramic or metal support substrates and an overlying forsterite-cordierite-type glass/ceramic green tape composition during firing at temperatures up to 950° C. of 1% or less. Suitable bonding glasses have a thermal coefficient of expansion higher than that of the ceramic or metal support substrate, and they must have a high softening point. The present glasses have a coefficient of expansion in the range of $75-110 \times 10^{-7}/°C$.

In particular, the glass/ceramics can be bonded to a copper clad metal substrate of Cu/Mo/Cu that can be fired with low shrinkage using a bonding glass of the invention. The bonding glass is screen printed to the metal substrate, patterned, the multilayer green tape layers aligned with the metal substrate so as to permit a connection between the circuits in the green tape layers and contacts or vias in the metal substrate, and fired. The bonding glass layer reduces shrinkage in the x and y lateral directions of the green tape layers to less than 1%.

BRIEF DESCRIPTION OF THE DRAWING

FIG. 1 is a cross sectional view of an electronic package that employs the bonding glass layer of the invention.

DETAILED DESCRIPTION OF THE INVENTION

In order to maintain a very low shrinkage between a co-fired ceramic and a ceramic or metal support substrate during sintering, a bonding glass layer is required that is quite specific to the co-fired ceramic green tape composition and to the support substrate. The surface of the support substrate, the chemical composition of the ceramic, the softening point and the sintering characteristics of the ceramic green tape and the thermal expansion characteristics of both the material of the support substrate and of the ceramic must be taken into consideration. The bonding glass layer should have a softening point below about 800° C. and below that of the glass ceramic of the green tape, and must have good adhesion both to the support substrate and to the overlying green tape layer. The bonding glass preferably has a sintering temperature about 25°–250° C. below that of the glass used to make the green tape in order to prevent or restrain the shrinkage of the overlying ceramic during firing. The bonding glass can have a higher coefficient of expansion than that of the glass/ceramic or the support substrate.

Magnesium oxide-aluminosilicate glasses are widely used for making ceramic multilayer printed circuit boards because of their high strength and low thermal coefficient of expansion properties. High strength is not required for the present application because high strength is contributed by the ceramic or metal support substrate. The prior art desired a thermal coefficient of expansion that was matched to silicon, the material used to make most of the present-day semiconductor devices. Other properties of cordierite-type glasses however are of interest here, such as low loss, low dielectric constant and the like.

The glasses useful herein for making the circuit boards are magnesium oxide-aluminosilicate glasses of the forsterite crystal phase field, which have a higher thermal coefficient of expansion than cordierite. Thus the forsterite glasses have certain properties such as low dielectric constant, low loss and the like that are of interest here, but they exhibit a higher thermal coefficient of expansion. Silicon has a thermal coefficient of expansion of about $22-23 \times 10^{-7}/°$ C., whereas the present ceramic or metal support substrates generally have a higher thermal coefficient of expansion of about $45-55 \times 10^{-7}/°$ C.

The metal substrate currently preferred as a support substrate is a nickel plated (to a thickness of about 25 microns) copper/molybdenum/copper (13/74/13) metal substrate commercially available from Climax Metals Co. However, other substrate materials can also be used, including Kovar, Invar or composites such as Cu/W/Cu, Cu/Invar/Cu or Cu/Kovar/Cu and the like. Ceramic substrates can also be used, such as of aluminum nitride, silicon carbide, diamond and the like, all of which materials exhibit good thermal conductivity. The major surfaces of the metal substrates can be cleaned and plated, as with nickel, to a thickness of 0.5–25 microns using conventional nickel plating techniques.

The ceramic green tape compositions of interest herein are comprised of particular glasses of the forsterite-cordierite type, i.e., $MgO-Al_2O_3-SiO_2$ type glasses, that can contain minor amounts of other metal oxides.

For example, the green tape glasses are suitably made from the following oxide compositions:

| Component | GLASS A Weight, % | GLASS B Weight, % |
|---|---|---|
| $SiO_2$ | 45 | 45 |
| $Al_2O_3$ | 22 | 22 |
| $MgO$ | 29 | 26 |
| $P_2O_5$ | 1.5 | 1.5 |
| $B_2O_3$ | 1.0 | 1.5 |
| $PbO$ |  | 4 |
| $ZrO_2$ | 1.5 |  |

Mixtures of the above glasses in any amounts can also be employed. The above glasses can also contain minor (less than 50% by weight) amounts of other glasses. Such glasses include crystalline cordierite, up to 20% by weight, lead bisilicate, up to 40% by weight, up to 25% by weight of a $CaO$ (26.8%)-$MgO$ (4.6%)-$ZnO$ (12.2%)-$Al_2O_3$ (15.4%)-$SiO_2$ (41.0%) glass, or up to 35% by weight of a $CaO$ (8.6%)-$ZnO$ (17.1%)-$MgO$ (20.9%)-$Al_2O_3$ (8.9%)-$SiO_2$ (40.5%)-$P_2O_5$ (2.0%)-$ZrSiO_4$ (2.0%) glass. Other like glasses can also be added.

In order to form a green tape composition, the above glasses or mixtures of glasses in the form of a powder is mixed with a plasticizer, an organic binder, a surfactant and a solvent mixture. Suitable plasticizers include a mixture of alkyl benzyl phthalates and alkyl esters commercially available as Santicizer 160 from the Monsanto Co. Suitable resin binders include Butvar B-98, a polyvinyl butyral, also from the Monsanto Co., a surfactant or deflocculant such as Menhaden fish oil, and a solvent mixture including methylethylketone, isopropanol, toluene, acetone, ethyl acetate, ethyl alcohol and the like. The manufacture of green tape compositions from the above glasses, resins and the like is conventional, and other known materials can be substituted. A slurry is formed of the above ingredients which are ball milled to form a uniform slurry. The slurry is formed into tape form, either in a mold or by doctor blading onto a polyester tape, and drying. The tape is then screen printed with a conductor ink to form the desired circuit pattern.

Conductor inks are made by mixing a conductive metal powder, as of gold, silver, copper and mixtures and alloys thereof and the like, with an organic vehicle which may include a resin binder, a solvent and a surfactant. These compositions are also well known. Via fill inks, used to fill vias between the ceramic layers, are made in essentially the same manner, although they can contain slightly higher quantities of glass powders.

The above screen printed green tapes are suitably fired at temperatures up to about 950° C.

However, since the green tape compositions shrink up to about 20% in all directions during this firing step, when such green tape compositions are employed on ceramic or metal support substrates, particularly on both side of the substrate, a bonding glass layer must be used to control or prevent shrinkage in the x and y lateral dimensions so that all of the circuits and via holes and contacts remain in alignment after firing. The presence of the bonding glass suppresses the shrinkage in two directions, permitting all of the shrinkage to occur in the z, or thickness, direction only.

The bonding layer is formed using a glazing ink, screen printed or otherwise coated onto the nickel plated surface of the support substrate, followed by heating to a temperature sufficient to remove the organic materials in the ink and fuse the glass and other inorganic constituents to obtain a glazed support surface. The composition of the glaze bonding layer, which is specific to particular combinations of metal and ceramic dielectric compositions, is critical to the successful fabrication of the support substrate-ceramic multilayer composite wherein the ceramic multilayer laminate structure undergoes no lateral or x and y dimension shrinkage, and wherein the support substrate and the ceramic multilayer structure are well adhered to each other to withstand mechanical and thermal stresses encountered during fabrication, assembly and use of the composite structure.

We have found two families of glasses that will bond the above green tape compositions to a nickel-plated Cu/Mo/Cu, Cu/Kovar/Cu or Cu/Invar/Cu composite, or Invar or Kovar support substrate or core, and limit the shrinkage of the green tape laminate to less than 1%. We have further found that these glasses, either used alone or in admixture with bismuth trioxide in an amount up to one third by weight of said mixture, form bonding glazes that can accomplish the desired suppression of x, y dimension shrinkage suppression in the green tape laminates made with the above-described magnesium aluminosilicate glasses, to yield supported ceramic composites having good mechanical and thermal integrity.

The first family of glasses can be classified as zinc borate glasses containing other modifying oxides in minor amounts. A useful composition range for a glass suitable in a bonding glaze is, in percent by weight, from 45–55% zinc oxide, ZnO, from 30–40% boron oxide, $B_2O_3$, from 3–7% of calcium oxide, CaO, and from 3–7% of aluminum oxide, $Al_2O_3$. A particularly useful glass (No. 1) has the composition 50% by weight of ZnO, by weight of $B_2O_3$, 5% by weight of CaO, and 6% by weight of $Al_2O_3$.

The second family of glasses suitable for a bonding glaze composition for use herein are borosilicate glasses modified by oxides of barium, zinc and aluminum and other oxides. A useful composition range for a glass suitable in a bonding glaze is, in percent by weight, from 20–45% of barium oxide, BaO, from 5–15% of calcium oxide, from 15–22% of zinc oxide, from 15–25% of silicon oxide, $SiO_2$, and from 15–25% of boron oxide. Two illustrative suitable glasses of the second family of glasses are given below:

| Oxide | No. 2 % by weight | No. 3 % by weight |
| --- | --- | --- |
| BaO | 42.7 | 20.4 |
| CaO | 6.25 | 14.9 |
| ZnO | 13.6 | 21.6 |
| $SiO_2$ | 16.7 | 25.0 |
| $B_2O_3$ | 19.4 | 23.1 |
| $Sb_2O_3$ | 0.25 | |
| $CeO_2$ | 1.0 | |

A fluxing agent of bismuth oxide can be added in an amount up to about 30% by weight of the above bonding glass composition, if desired. Bismuth oxide improves the flow and adhesion characteristics of these glasses.

The glass bonding layer will have a coefficient of thermal expansion greater than that of the support substrate employed. The bonding layer can be applied as a slurry to one or both of the major surfaces of the metal substrate. The slurry can be applied by screen printing, spraying, spin coating, curtain coating, fluidized bed coating, electrophoretic deposition or other equivalent methods, although screen printing is the method of choice when preparing multilayer circuit boards. Preferably the bonding glass composition is applied to the support substrate and heated above its flow temperature so that a thin, e.g., 10 to 50 microns, layer of uniform thickness is formed on the support substrate.

The bonding glass is preferably applied to the ceramic or metal substrate by standard thick film ink screen printing methods. Suitable inks can be made by mixing the bonding glass powder with a resin binder, such as Elvacite 2045 made by dupont de Nemours and Company, or ethyl cellulose, polyacrylates, polymethacrylates, polyesters, polyolefins and the like, and a suitable solvent including pine oil, terpineol, butyl carbitol acetate, Texanol™, a 2,2,4-trimethyl-1,3-pentanediol monoisobutyrate available from Texas Eastman Company, and the like. The vehicle generally contains from about 2 to about 25 percent by weight of the resin binder.

The bonding glass can then be patterned so that electrical contacts can be made between the circuits on the multilayer ceramic overlayers to the metal core and its contacts and vias. The bonding glass, after application to the support substrate, is reflowed by heating to a temperature between about 750°–875° C. to permit easy handling of the support substrate and to provide a uniformly thick layer on the substrate.

A multilayer ceramic circuit board is made from the bonding glass coated support substrate by aligning a preformed multilayer green tape laminate, including multiple stacked layers of a ceramic composition having a printed circuit thereon as described hereinabove, which stack may have been preheated, so that the vias and printed circuits are aligned, and firing to a suitable temperature of up to about 950° C. Firing may be in nitrogen or in air, depending upon the composition of the various layers and printed circuits. The firing parameters of time and temperature can be adjusted to control the crystallinity of the green tape glass, which in turn will control the expansion of the various layers.

FIG. 1 is illustrative of a microelectronic package employing the bonding layer of the present invention. The co-fired-ceramic on metal structure 10 comprises a metal base 12 having first and second major surfaces 14 and 16. A glass bonding layer 18 of the invention covers one or both major surfaces 14 and 16. A multiple layer stack of laminated and glass-ceramic/filler tape 19, having openings therein 20 for placing semiconductor devices 24. The printed circuits and vias (not shown) in the glass ceramic stack 19 are made from conductive metal powders such as copper, silver, silver/palladium alloy, gold, alloys thereof and the like.

After co-firing the bonding glass-substrate core to the ceramic stack, semiconductor devices 24 are assembled on the substrate by wire bonds 28 or other means known to those skilled in the art, to electrically connect the printed circuit stack to the semiconductor devices. The chips are then sealed either by brazing metal lids (not shown) to the substrate, or by dispensing an organic encapsulant (not shown) on the chip.

The invention will be further described in the following Examples, but the invention is not meant to be limited to the details described therein.

EXAMPLE 1

A nickel plated Cu/Mo/Cu (14/62/14) support substrate 0.020 inch in thickness was prepared by screen printing a patterned layer of a bonding glaze ink containing powder of the bonding glass No. 2, followed by firing to 850° C. in air to reflow and fuse the bonding glass layer to the substrate.

Six layers of green tape made using the forsterite-cordierite glass described hereinabove, each green tape having a screen printed thick film circuit pattern thereon made from silver inks, and punched via holes filled with suitable silver-containing via inks, were aligned together and laminated at a pressure of 1500 psi at 90° C.

The green laminate was then pressed onto the glazed surface of the support substrate and the assembly was fired in air to a peak temperature of 900° C. A sintered glass-ceramic multilayer substrate integrally bonded to the Cu/Mo/Cu support substrate was obtained.

The fired ceramic laminate was found to be well adhered to the support substrate and had undergone no x, y shrinkage during the above firing step, all of the firing shrinkage having occurred in the z direction.

EXAMPLE 2

Following the procedure of Example 1, a bonding glaze ink was substituted which contained a mixture of powdered bonding glass No. 1 and bismuth oxide in a ratio by weight of 3:1.

Again, a composite multilayer ceramic structure on a Cu/Mo/Cu support substrate was obtained that had undergone no x, y shrinkage during the firing step.

EXAMPLE 3

Six layers of green tape made using another dielectric glass having a composition, in % by weight of magnesium oxide, 32.5%, barium oxide, 17%, aluminum oxide, 7%, silicon oxide, 24%, boron oxide, 16%, zirconium dioxide, 2.5% and phosphorus pentoxide, 1%, each having screen printed thick film circuit patterns made from silver inks thereon, and punched via holes filled with a suitable silver-containing via ink, were aligned together and laminated at a pressure of 1500 psi at 90° C.

Separately, a support substrate of Kovar, 0.020 inch in thickness, was prepared by screen printing a patterned layer of a bonding glaze ink containing the glass No. 1, followed by firing to 850° C. in air to reflow and fuse the bonding glass layer to the substrate. The green laminate as above was then pressed onto the glazed surface of the support substrate and the assembly was fired in air to a peak temperature of 900° C.

A sintered glass-ceramic multilayer substrate, integrally bonded to the Kovar support substrate, was obtained.

The green tape laminate was found to be well adhered to the Kovar support substrate, and had undergone no x, y shrinkage during the firing step. Thus all of the firing shrinkage occurred in the z direction.

Although the present invention has been described in terms of specific embodiments, one skilled in the art can readily substitute other resins and materials used to make green tape and conductor inks, other metal substrates and other bonding glasses providing they meet the criteria set forth above. Thus the invention is meant only to be limited by the appended claims.

We claim:

1. A method of making a ceramic multilayer circuit board comprising a multilayer ceramic green tape stack made from forsterite-cordierite-type glasses having circuitry thereon and a ceramic or nickel plated metal support substrate comprising depositing a bonding glass on a surface of said support substrate, said bonding glass having a flow temperature and comprising an oxide mixture including calcium, zinc and boron oxides, patterning said bonding glass layer, aligning said coated support substrate with a multilayer green tape stack so that contact can be made between vias in said support substrate and the circuitry in said green tape stack, and firing the aligned coated substrate and green tape stack to a temperature above the flow temperature of the bonding glass so as to bond the resulting multilayer ceramic stack to said support substrate thereby limiting the shrinkage in the multilayer ceramic stack.

2. A method according to claim 1 wherein said support substrate having said bonding glass layer thereon is heated to a temperature above the flow temperature of the bonding glass prior to aligning with said green tape stack.

3. A method according to claim 1 wherein said support substrate is a nickel plated Kovar or Invar plate.

4. A method according to claim 1 wherein said support substrate is a nickel plated composite plate selected from the group consisting of Cu/Mo/Cu, Cu/Invar/Cu and Cu/Kovar/Cu.

5. A method according to claim 1 wherein said bonding glass is deposited on both surfaces of said substrate.

6. A method according to claim 5 wherein a green tape stack is aligned on both sides of said support substrate.

7. A method according to claim 1 wherein said bonding glass is a glass having the composition of from 20–45% by weight of barium oxide, from 5–15% by weight of calcium oxide, from 15–22% by weight of zinc oxide, from 15–25% by weight of silicon oxide, from 15–25% by weight of boron oxide and up to 2% by weight of additional metal oxides.

8. A method according to claim 7 wherein said bonding glass has the composition consisting essentially of 42.7% by weight of barium oxide, 6.25% by weight of calcium oxide, 13.6% by weight of zinc oxide, 16.7% by weight of silicon oxide, 19.5% by weight of boron oxide and minor amounts of additional metal oxides.

9. A method according to claim 7 wherein said bonding glass has the composition consisting essentially of 20.4% by weight of barium oxide, 14.9% by weight of calcium oxide, 21.6% by weight of zinc oxide, 25% by weight of silicon oxide, and 23.1% by weight of boron oxide.

10. A method according to claim 1 wherein up to about 30% by weight of bismuth oxide is added to said bonding glass.

11. A method of making a ceramic multilayer circuit board comprising a multilayer ceramic green tape stack made from forsterite-cordierite-type glasses having circuitry thereon and a ceramic or nickel plated metal support substrate comprising depositing a bonding glass on a surface of said support substrate, said bonding glass having the composition of from 45–55% by weight of zinc oxide, from 30–40% by weight of boron oxide, from 3–7% by weight of calcium oxide and from 3–7% by weight of aluminum oxide, said bonding glass having a flow temperature, patterning said bonding glass layer, aligning said coated support substrate with a multilayer green tape stack so that contact can be made between vias in said support substrate and the circuitry in said green tape stack, and firing the aligned coated substrate and green tape stack to a temperature above the flow temperature of the bonding glass so as to bond the resulting multilayer ceramic structure to said support substrate.

12. A method according to claim 11 wherein said bonding glass has a composition consisting essentially of 50% by weight of zinc oxide, 39% by weight of boron oxide, 5% by weight of calcium oxide and 6% by weight of aluminum oxide.

* * * * *